United States Patent [19]

Bigelow

[11] Patent Number: 5,310,512

[45] Date of Patent: May 10, 1994

[54] METHOD FOR PRODUCING SYNTHETIC DIAMOND STRUCTURES

[75] Inventor: Louis K. Bigelow, Salt Lake City, Utah

[73] Assignee: Norton Company, Worcester, Mass.

[21] Appl. No.: 614,313

[22] Filed: Nov. 15, 1990

[51] Int. Cl.$^5$ .............................. B28B 1/02; B28B 7/30

[52] U.S. Cl. ........................................ 264/25; 264/81; 264/310; 264/313; 264/338; 427/249; 427/577

[58] Field of Search ................... 264/81, 317, 309, 313, 264/338, 310, 25; 427/249, 577

[56] References Cited

U.S. PATENT DOCUMENTS

| | | | |
|---|---|---|---|
| 4,174,365 | 11/1979 | Pahl | 264/317 |
| 4,434,188 | 2/1984 | Kamo et al. | 427/39 |
| 4,471,003 | 9/1984 | Cann | 427/34 |
| 4,487,162 | 12/1984 | Cann | 118/723 |
| 4,507,588 | 3/1985 | Asmussen et al. | 315/39 |
| 4,585,668 | 4/1986 | Asmussen et al. | 427/38 |
| 4,630,566 | 12/1986 | Asmussen et al. | 118/50.1 |
| 4,691,662 | 9/1987 | Roppel et al. | 118/50.1 |
| 4,987,002 | 1/1991 | Sakamoto et al. | 264/81 |
| 5,183,529 | 2/1993 | Potter et al. | 427/226 |

FOREIGN PATENT DOCUMENTS

| | | |
|---|---|---|
| 365366A | of 0000 | European Pat. Off. . |
| 0055542 | 7/1982 | European Pat. Off. . |
| 0417924 | 3/1991 | European Pat. Off. . |
| 63-307196 | 12/1988 | Japan . |

OTHER PUBLICATIONS

T. Obata et al., "Free-Standing Diamond Films Plates Tubes and Curved Diaphragms.", SPIE, Diamond Optics, vol. 1146, pp. 208-216, Dec. 31, 1989.

S. Matsumoto et al., "Substrate Bias Effect On Diamond Deposition By DC Plasma Jet", Japanese Journal Of Applied Physics, vol. 13, No. 145, pp. 2082-2086, Tokyo, Japan, Oct. 1, 1990.

S. Matsumoto et al. "Substrate Bias Effect On Diamond Deposition By DC Plasma Jet", Japanese Journal Of Applied Physics, vol. 29, No. 10, pp. 2082-2086, Oct. 1, 1990.

K. A. Snail et al., "Hemispherical Transmittance Of Several Free Standing Diamond Films", SPIE Diamond Optics, vol. 1146, pp. 144-151, London, GB, Dec. 31, 1989.

B. Cooper, "A new Generation Of IR Windows", Photonics Spectra, Jun. 1990.

P. D. Gigl, "New Synthesis Techniques, Properties, And Applications For Industrial Diamond", IDA Ultrahard Materials Seminar, Toronto, Canada (Sep., 1989).

"Diamond And Diamond-Like Coatings: A Techno--Economic Assessment", Gorham Advanced Materials Institute, vol. 1, title page and pp. 5-22-5-40.

B. V. Spitzyn, L. L. Boulov, and B. V. Derjaguin, "Diamond And Diamond-Like Films: Deposition From The Vapor Phase, Structure And Properties", Progress in Crystal Growth and Characterization 17, pp. 79-170 (1988).

*Primary Examiner*—Jan H. Silbaugh
*Assistant Examiner*—Christopher A. Fiorilla
*Attorney, Agent, or Firm*—Volker R. Ulbrich; Martin M. Novack

[57] ABSTRACT

Method and apparatus for producing a non-planar synthetic diamond structure of predetermined shape. A non-planar mandrel surface of the predetermined shape is provided and the mandrel surface is coated with a release substance. Synthetic diamond is deposited on the coating of release substance. The release substance is then activated to effect release of the deposited synthetic diamond structure. In a disclosed embodiment of the method of the invention a dome-shaped hollow mandrel is coated with a metal-containing substance, and synthetic diamond is deposited over the coating using a plasma jet deposition process. The metal containing substance is then heated to release the resultant diamond structure from the mandrel. In a form of the disclosed method, the metal-containing substance is a metal alloy which is highly polished before deposition of synthetic diamond thereon. The step of depositing synthetic diamond may include varying the deposition conditions during the depositing of diamond to obtain layers of diamond having different properties. In an embodiment of the apparatus of the invention, means are provided for rotating the mandrel in a deposition chamber, and means are also provided for moving the deposition system in the chamber, such as in an arc over the rotatable mandrel.

26 Claims, 2 Drawing Sheets

METHOD FOR PRODUCING SYNTHETIC DIAMOND STRUCTURES

BACKGROUND OF THE INVENTION

This invention relates to production of synthetic diamond structures, particularly those which are non-planar and, more particularly, to an apparatus and method for producing non-planar diamond structures such as curved windows or free-standing domes.

Diamond has a number of properties which make it attractive for use as window material, free-standing domes, or other non-planar structures for various applications. Curved windows and domes are often used to separate a delicate sensor and/or transmitter from an outside environment. Among these properties are extreme hardness and excellent transmissivity of certain radiation. Diamond is also substantially inert, a good heat conductor, thermally stable, and an electrical insulator. However, natural diamond is prohibitively expensive for applications which require any substantial size and is difficult to form into certain shapes.

In recent years, a number of techniques have been developed for depositing synthetic diamond on surfaces of various shapes to obtain a diamond film or coating on tool surfaces and devices. These techniques include so-called high-pressure high-temperature ("HPHT") methods and chemical vapor deposition ("CVD") methods. The CVD methods include plasma deposition techniques wherein, for example, plasmas of a hydrocarbon and hydrogen are obtained using microwave energy or electrical arcing. The resultant plasma can be focused and accelerated toward a substrate using focusing and accelerating magnets. Examples of the general types of microwave plasma deposition systems that can be adapted for deposition of synthetic diamond are disclosed in U.S. Pat. Nos. 4,507,588, 4,585,668, 4,630,566 and 4,691,662. Examples of the general types of plasma jet deposition systems that can be adapted for deposition of synthetic diamond are disclosed in U.S. Pat. Nos. 4,471,003 and 4,487,162.

Although synthetic diamond has been successively deposited on tool and device surfaces for various purposes, to applicant's knowledge there are few, if any, commercially viable techniques for producing non-planar free standing diamond structures for use as windows, domes and other precisely shaped contoured structures for the types of applications wherein the above-mentioned properties of diamond are beneficial. In addition to the difficulty of obtaining a uniform thickness and quality of synthetic diamond, the production of an ultimately free-standing diamond structure poses a number of fabrication problems. It is among the objects of the present invention to provide a practical method and apparatus for producing such structures.

SUMMARY OF THE INVENTION

The present invention is directed to an apparatus and method which, inter alia, can be used to produce non-planar free-standing synthetic diamond structures having controlled thicknesses. Among the problems addressed by the invention are the difficulty of conforming the deposition of synthetic diamond to a predetermined shape, the difficulty of obtaining controlled and uniform deposition of synthetic diamond having good structural integrity, and the difficulty of effecting controlled release of the ultimately produced synthetic diamond structure at the appropriate time and without loss of integrity of the structure.

In accordance with an embodiment of the invention, there is disclosed a method for producing a non-planar synthetic diamond structure of predetermined shape. A non-planar mandrel surface of the predetermined shape is provided and the mandrel surface is coated with a release substance. Synthetic diamond is deposited on the coating or release substance. The release substance is then activated to effect release of the deposited synthetic diamond structure. In a disclosed embodiment of the method of the invention, a dome-shaped hollow mandrel, having a coefficient of expansion close to that of diamond, is coated with a metal-containing substance, and synthetic diamond is deposited over the coating using a plasma jet deposition process. The metal containing substance is then heated to release the resultant diamond structure from the mandrel. In the preferred form of the disclosed method of the invention, the metal-containing substance is a metal alloy which is highly polished before deposition of the synthetic diamond thereon. The step of depositing synthetic diamond may include varying the deposition conditions during the depositing of diamond to obtain layers of diamond having different properties.

In accordance with an embodiment of an apparatus of the invention, a deposition chamber is provided, and means are provided for controlling the pressure in the chamber. A hollow non-planar mandrel is provided in the chamber, the mandrel having a non-planar surface formed of a material that preferably has a coefficient of expansion that is reasonably well matched to the coefficient of expansion of diamond, and a coating of a metal-containing substance is provided on the mandrel. Diamond deposition means are provided in the chamber for depositing synthetic diamond on the coated mandrel. In a disclosed embodiment of the apparatus, the synthetic diamond deposition means comprises a plasma jet deposition system, and means are provided for controlling the temperature of the mandrel. During deposition, the metal-containing substance can melt, but will be held in place by surface tension. This tends to reduce any thermal stresses that would otherwise be caused by the mandrel.

In a disclosed embodiment of the invention, means are provided for rotating the mandrel in the chamber, and means are also provided for moving the deposition system in the chamber, such as in an arc over the rotatable mandrel.

Further features and advantages of the invention will become more readily apparent from the following detailed description when taken in conjunction with the accompanying drawings.

DESCRIPTION OF THE PREFERRED EMBODIMENT

Figure 1:
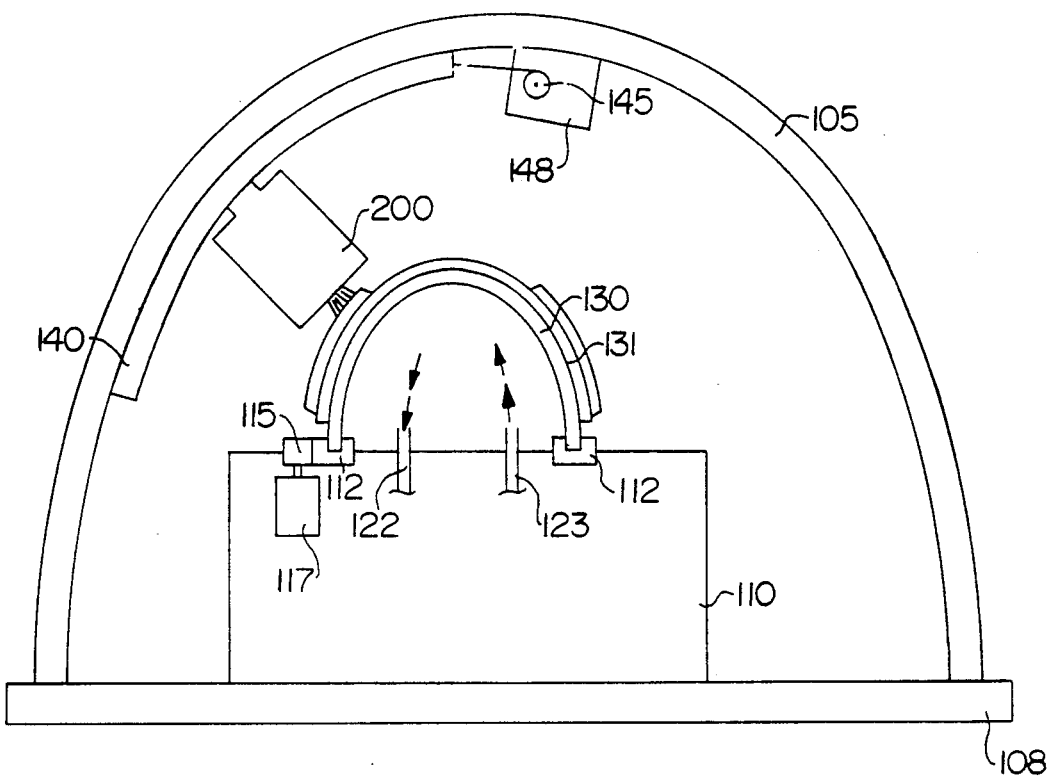
FIG. 1 is a diagram, partially in block form, of an apparatus in accordance with the invention and which can be used to practice an embodiment of the method of the invention.

Referring to FIG. 1, there is shown an apparatus in accordance with an embodiment of the invention and which can be used to practice an embodiment of the method of the invention. A vacuum-tight reaction chamber 105 is provided on a base 108. The chamber and its base may be formed, for example, of a suitable metal such as stainless steel, and an observation window can be provided. Supported on the base 108 is a table 110 which contains a rotatable annular ring 112. The annular ring 112 can be supported on bearings (not shown) and is provided with a suitable mechanism for driving, such as teeth which engage a gear wheel 115 that is driven by a motor 117 supported in the table 110. The motor 117 is controlled, via a control cable, by means (not shown) outside the chamber 105. Alternatively, a belt drive can be employed. The table 110 also contains means for cooling or heating. In the present embodiment, fluid lines 122, 123 are provided for cooling. A mandrel 130 is positioned in an annular receiving groove of the rotatable annular ring 112. In the illustration, the mandrel is in the shape of a hollow dome, but it will be understood that it can have any suitable nonplanar shape, for example a desired curved shape. The mandrel is of a material that has a coefficient of expansion that is reasonably well matched to that of diamond. Examples of suitable materials are $Si_3N_4$, quartz, tungsten and molybdenum, the choice also being function of thermal conductivity requirements.

Figure 2:
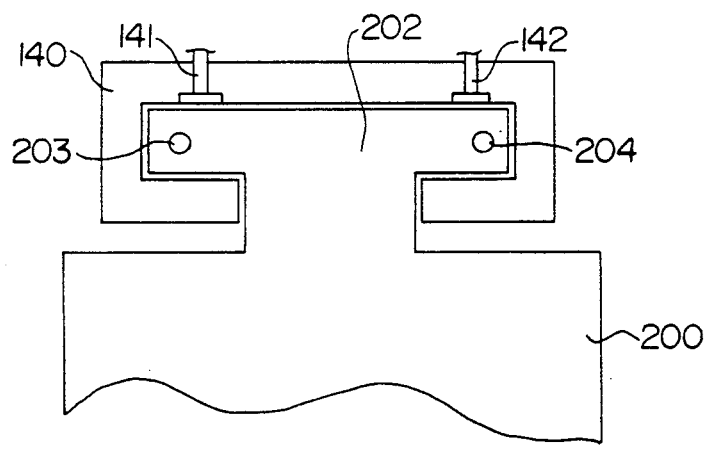
FIG. 2 is a diagram showing a portion of the track and moveable deposition system of the FIG. 1 embodiment.

In the present embodiment, a plasma jet deposition system 200 is utilized for deposition of synthetic diamond. A similar deposition apparatus is disclosed in U.S. patent application Ser. No. 07/614,900, filed Nov. 16, 1990, and assigned to the same assignee as the present application. The system 200 is mounted on a track 140 that is secured to the inner wall of chamber 105. The track 140 forms an arc in the chamber, and a drive mechanism is used to move the system in the track 140. An example of a track 140 with the system 200 moveably coupled thereto is illustrated in FIG. 2, although it will be understood that alternative arrangements can be utilized, and the invention is not dependent upon a particular manner of mounting or moving the deposition system or the mandrel. FIG. 2, shows a cross-section of the arc-shaped track 140 of FIG. 1, together with a portion of the base 202 of the deposition system 200 which engages the track 140 and is movable thereon. The track 140 can be riveted o bolted to the chamber 105, bolts 141 and 142 being illustrated in FIG. 2. The base 202 of system 200 has a T-shaped cross-section, and the track 140 encloses and guides the base 202. Any suitable drive means can be employed. In the illustration, one or more drive cables (e.g. at 203 and 204) are connected to the base and are controlled by pulleys 145 driven by servomechanism 148 (FIG. 1) which lifts and lowers the system 200 against the force of gravity. Again, control can be from outside the chamber via suitable wiring (not shown). In the illustrated embodiment, the chamber is semispherical, and the track 140 is generally along an arc in the semi-sphere. It will be understood, however, that other suitable configurations can be employed.

Figure 3:
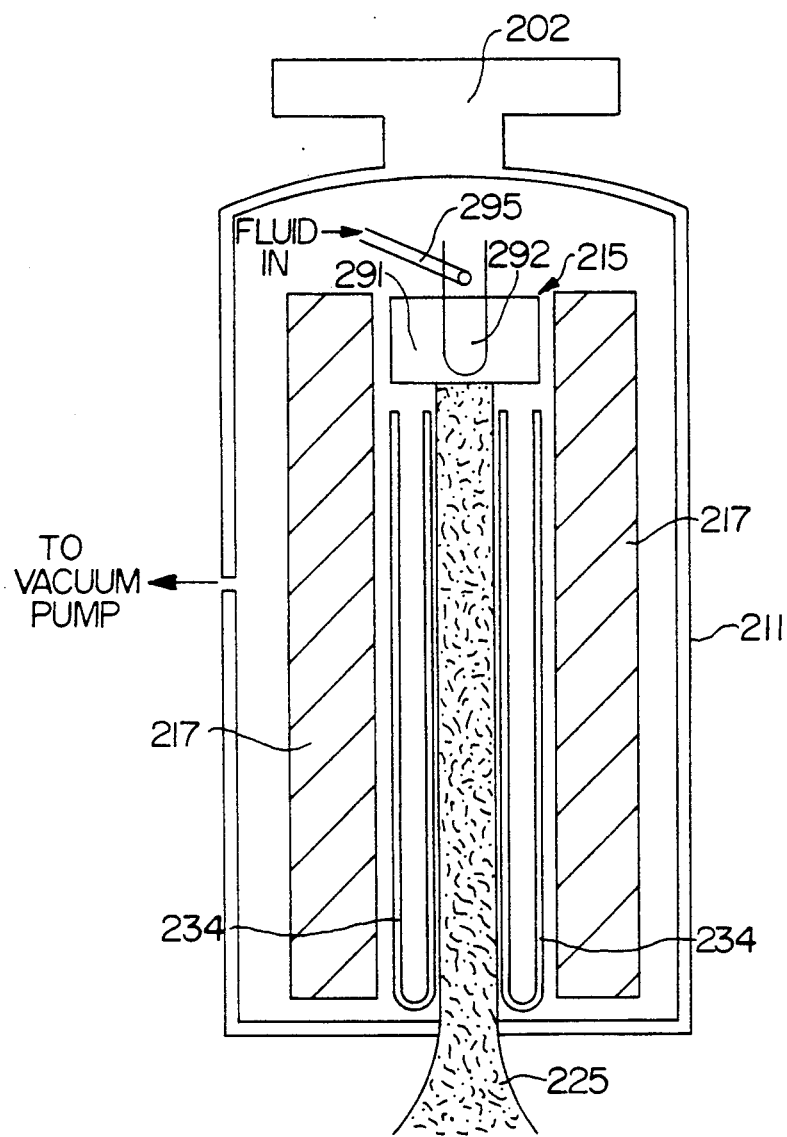
FIG. 3 is a simplified diagram of a plasma jet deposition system of the type which can be used in an embodiment of the invention.

FIG. 3 shows a simplified diagram of a type of plasma jet deposition apparatus 200 which can be utilized in the FIG. 1 embodiment. Reference can also be made to U.S. Pat. Nos. 4,471,003 and 4,487,162. The system 200 is contained within a vacuum housing 211 secured to the base 02, and includes an arc-forming section 215 which comprises a cylindrical anode 291, a rod like cathode 292, and an injector 295 mounted adjacent the cathode so as to permit injected fluid to pass over the cathode 292. In the illustrated embodiment the input fluid may be a mixture of hydrogen and methane and may be coupled to the system 200 from outside the chamber via suitable feed lines (not shown). The anode 291 and cathode 292 are energized by a source of electric potential (not shown), for example a DC potential. Cylindrical magnets, designated by reference numeral 217, are utilized to accelerate and focus the plasma generated at the arc forming section. The magnets maintain the plasma within a narrow column until the plasma reaches the deposition region, which is generally the region of the coated mandrel. Cooling coils 234, in which liquid nitrogen can be circulated, are located within the magnets and surround the focused plasma. In operation, a mixture of hydrogen and methane is fed to the injector 295, and a plasma is obtained in front of the arc forming section and accelerated and focused toward the deposition region. The temperature and pressure at the plasma formation region are preferably in the approximate ranges 1500–2700 degrees C and 100–700 torr, respectively, and in the deposition region are in the approximate ranges 800–1100 degrees C and 10–200 torr, respectively. As is known in the art, synthetic polycrystalline diamond can be formed from the described plasma, as the carbon in the methane is selectively deposited as diamond, and the graphite which forms is dissipated by combination with hydrogen.

An example of operation of the apparatus of the FIG. 1 embodiment, as utilized to produce a diamond dome in accordance of an embodiment of the a method of the invention, is as follows: A metal coating 131 is applied to the mandrel. The coating may be, for example, an alloy having a melting temperature less than about 1200 degrees C, and a thickness in a range about 250 angstroms to 100 micrometers. The alloy may be, for example, TZM, an alloy of titanium, zirconium, and molybdenum. Molybdenum alone can also be utilized. The coating can be applied, for example, by vapor deposition, and the surface of the coating is preferably highly polished, such as to an optical finish. The application of the metal coating and the polishing thereof can be implemented in known fashion, if desired, before the mandrel is placed in the chamber 200. If polishing of the coating is not implemented and a rougher diamond surface is obtained, it can be polished, if desired, after removal of the dome from the mandrel.

After placing the mandrel in the deposition chamber 200, and initializing the position of the deposition system 200 on the track 140 (for example, to its lowermost position), a cooling medium is provided within the mandrel, such as by feeding and exhausting a cooling fluid through inlet and outlet lines 122, 123. A thin layer (for example, 1 to 10 micrometers) of nanocrystalline diamond is then deposited on the cooled metal-coated mandrel by operating the plasma jet deposition system as the mandrel rotates on the rotating annular ring 112 of table 110. As the mandrel is rotated, the position of the deposition system 200 is incremented in the track 140. The rotation of the mandrel can be continuous and/or in discrete steps, and the motion of the system 200 in the track 140 can also be continuous and/or discrete. The rate of motion will depend upon the deposition rate and the desired thickness of the diamond layer.

Depending upon the application for which the diamond structure of the illustrated embodiment is to be used, it may be desirable to have the inner and/or outer surface thereof be of optical quality, and the deposition parameters can be selected to provide the desired quality of deposited diamond. For example, operation in the supersonic regime (that is, with the plasma being accelerated toward the target at a supersonic velocity) is preferred for obtainment of optical quality inner and/or outer surfaces Deposition during this type of operation will typically be at a relatively slow rate, and operation in the subsonic regime can be used (e.g. with flow rate, pressure, and mandrel temperature being increased), during deposition of the bulk central thickness of the structure, at a relatively faster deposition rate.

It will be understood that the number of passes over the surface being deposited, and the thickness applied per pass, can vary with the application.

During deposition of diamond layer(s) 132, the metal coating may melt, but the metal will be substantially held in place by surface tension. Thermal stresses from the mandrel will be reduced by the presence of the metal interlayer, and temperature may be cycled to create internal tensile and compressive stresses in the structure being produced, and reduce the tendency of the structure to warp when it is removed from the mandrel.

When the deposition of the diamond structure is complete, the mandrel (with metal coating and diamond structure thereon) can be removed from the chamber 105; and heated to about the melting temperature of the coating metal, so that the diamond structure can be removed from the mandrel.

It will be understood that deposition parameters can be selected to provide varying growth structures, renucleation, and other features which improve strength, toughness or optical properties.

The invention has been described with reference to a particular preferred embodiment, but variations within the spirit and scope of the invention will occur to those skilled in the art. For example, it will be understood that other types of diamond deposition systems can be employed. Also, a further supporting mandrel may be formed around the diamond structure, before or after removal of the internal mandrel.

I claim:

1. A method for producing a synthetic diamond structure, comprising the steps of:
    providing a mandrel;
    coating the mandrel with a metal;
    depositing synthetic diamond on said metal coating to form a synthetic diamond structure; and
    removing the synthetic diamond structure from said metal coating by heating said metal to about its melting point.

2. The method as defined by claim 1, wherein said step of providing a mandrel comprises providing a non-planar mandrel.

3. The method as defined by claim 2, further comprising the steps of polishing said coating before depositing said synthetic diamond thereon.

4. The method as defined by claim 3, wherein said metal coating has a thickness in the range about 250 Angstroms to 100 micrometers.

5. The method as defined by claim 3, wherein said step of depositing synthetic diamond comprises applying a plasma jet of a hydrocarbon and hydrogen over said metal coating.

6. The method as defined by claim 5, wherein said step of depositing synthetic diamond includes varying the deposition conditions during the depositing of said diamond to obtain layers of diamond having different properties.

7. The method as defined by claim 3, wherein said step of providing a non-planar mandrel comprises providing a hollow mandrel.

8. The method as defined by claim 2, wherein said metal coating has a thickness in the range about 250 Angstroms to 100 micrometers.

9. The method as defined by claim 8, wherein said metal coating has a melting point of less than about 1200 degrees C.

10. The method as defined by claim 2, wherein said metal coating has a melting point of less than about 1200 degrees C.

11. The method as defined by claim 2, wherein said step of providing a non-planar mandrel comprises providing a hollow mandrel.

12. The method as defined by claim 2, wherein said step of depositing synthetic diamond includes rotating said mandrel.

13. The method as defined by claim 12, wherein said step of depositing synthetic diamond includes moving a deposition system with respect to said mandrel.

14. The method as defined by claim 1, wherein said step of depositing synthetic diamond comprises applying a plasma jet of a hydrocarbon and hydrogen over said metal coating.

15. The method as defined by claim 14, wherein said step of depositing synthetic diamond includes varying the deposition conditions during the depositing of said diamond to obtain layers of diamond having different properties.

16. The method as defined by claim 1, wherein said step of depositing synthetic diamond includes varying the deposition conditions during the depositing of said diamond to obtain layers of diamond having different properties.

17. The method as defined by claim 14, wherein said step of varying the deposition conditions includes varying the deposition rate.

18. The method as defined by claim 16, further comprising the step of cycling the temperature of said mandrel during said deposition of synthetic diamond.

19. The method as defined by claim 1, further comprising the step of cycling the temperature of said mandrel during said deposition of synthetic diamond.

20. The method as defined by claim 1, wherein said step of depositing synthetic diamond includes moving a deposition system with respect to said mandrel.

21. A method for producing a free-standing synthetic diamond dome, comprising the steps of:
    providing a hollow dome-shaped mandrel in a deposition chamber;
    coating the mandrel with metal;
    depositing a layer of synthetic diamond on the metal coating to form a synthetic diamond dome; and
    heating said metal coating to about the melting point of said metal and removing said synthetic diamond dome from said metal coating.

22. The method as defined by claim 21, further comprising the step of polishing said metal coating before depositing said synthetic diamond thereon.

23. The method as defined by claim 21, wherein said step of depositing synthetic diamond comprises applying a plasma jet of a hydrocarbon and hydrogen over said coating.

24. The method as defined by claim 21, wherein said step of depositing synthetic diamond includes varying the deposition conditions during the depositing of said diamond to obtain layers of diamond having different properties.

25. The method as defined by claim 24, wherein said step of varying the deposition conditions includes varying the deposition rate.

26. The method as defined by claim 21, further comprising the step of cycling the temperature of said mandrel during said deposition of synthetic diamond.

* * * * *